(12) United States Patent
Gerstenhaber et al.

(10) Patent No.: US 9,276,531 B2
(45) Date of Patent: Mar. 1, 2016

(54) APPARATUS AND METHODS FOR AMPLIFIER INPUT PROTECTION

(71) Applicant: Analog Devices, Inc., Norwood, MA (US)

(72) Inventors: Moshe Gerstenhaber, Newton, MA (US); Rayal Johnson, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/262,255

(22) Filed: Apr. 25, 2014

(65) Prior Publication Data
US 2015/0311872 A1 Oct. 29, 2015

(51) Int. Cl.
*H03F 1/52* (2006.01)
*H03F 3/16* (2006.01)

(52) U.S. Cl.
CPC .................. *H03F 1/523* (2013.01); *H03F 3/16* (2013.01); *H03F 2200/441* (2013.01); *H03F 2200/471* (2013.01)

(58) Field of Classification Search
CPC ..... H03F 1/52; H03F 1/523; H03F 2200/426; H03F 2200/441; H03F 3/193; H03F 3/195; H03F 3/345; H03F 3/45273; H03F 3/45632; H03F 3/4565; H03F 3/45659; H03F 3/3042; H03F 3/217; H03F 2200/504; H03F 2200/78; H03F 2200/444; H03F 3/19; H03F 3/45071; H03F 3/45183; H03F 3/45085; H03F 2203/45674; H03G 3/3042
USPC ................. 330/69, 207 P, 257, 288, 298, 300
See application file for complete search history.

(56) References Cited

U.S. PATENT DOCUMENTS

| 3,521,087 A | 7/1970 | Lombardi |
| 8,462,477 B2 | 6/2013 | Modica et al. |
| 2014/0104000 A1* | 4/2014 | Gerstenhaber et al. ....... 330/257 |

OTHER PUBLICATIONS

OP07, Analog Devices Data Sheet, "Ultralow Offset Voltage Operational Amplifier." Oct. 2011, 16 pages.
AD524, Analog Devices, "Precision Instrumentation Amplifier." Nov. 2007, 28 pages.
AMP02, Analog Devices, "High Accuracy Instrumentation Amplifier." Jan. 2003, 12 pages.
ADA4096-2/ADA4096-4, Analog Devices Data Sheet, "30 V, Micropower, Overvoltage Protection, Rail-to-Rail Input/Output Amplifiers." Mar. 2014, 24 pages.
Wurcer, et al., "A Programmable Instrumentation Amplifier for 12-Bit Resolution Systems." IEEE Journal of Solid-State Circuits, vol. SC-17, No. 6, Dec. 1982. 10 pages.

* cited by examiner

*Primary Examiner* — Khanh V Nguyen
(74) *Attorney, Agent, or Firm* — Knobbe Martens Olson & Bear LLP

(57) ABSTRACT

Apparatus and methods for amplifier input protection are provided. In certain implementations, an amplifier input protection circuit includes a first JFET electrically connected between a first input and a first output, and a second JFET electrically connected between a second input and a second output. Additionally, a first clamp is electrically connected to the first output, and a second clamp is electrically connected to the second output. A first current mirror mirrors a current through the first clamp, and provides the mirrored current to a third JFET electrically connected between the first JFET's source and gate. Additionally, a second current mirror that mirrors a current through the second clamp, and provides the mirrored current to a fourth JFET that is electrically connected between a source and gate of the second JFET. Configuring the protection circuit in this manner can provide the benefits of both low noise and low fault current.

20 Claims, 5 Drawing Sheets

APPARATUS AND METHODS FOR AMPLIFIER INPUT PROTECTION

BACKGROUND

1. Field

Embodiments of the invention relate to electronic systems, and more particularly, to input protection circuits for amplifiers.

2. Description of the Related Technology

An amplifier, such as an operational amplifier or instrumentation amplifier, can include an input protection circuit for protecting the amplifier from large input signals. Absent protection, large input signals can lead to overvoltage conditions and/or high levels of power dissipation, which can cause damage to the amplifier, such as damage to semiconductor junctions and/or electromigration in metal lines.

The input protection circuit can be used to provide the input signal to the amplifier's amplification circuitry when the input voltage signal is within a safe voltage range, such that the amplifier can amplify the input signal. For instance, in one example, the input protection circuit can provide the input signal to amplification circuitry when the voltage level amplifier's inputs are within a certain voltage range of the amplifier's power supply rails. However, when the input signal is large and falls outside the safe range, the input protection circuit can be used to block or otherwise impede the input signal from reaching the amplifier's amplification circuitry, thereby protecting the amplifier from damage.

SUMMARY

In one aspect, an amplifier input protection circuit is provided. The amplifier input protection circuit includes a first field-effect transistor (FET) including a source electrically connected to a first input and a drain electrically connected to a first output, a second FET including a source electrically connected to a second input and a drain electrically connected to a second output, a third FET including a gate and a source electrically connected to a gate of the first FET and a drain electrically connected to the first input, and a fourth FET including a gate and a source electrically connected to a gate of the second FET and a drain electrically connected to the second input. The amplifier input protection circuit further includes a first clamp electrically connected to the first output and configured to activate to generate a first clamp current in response to a first overvoltage condition. The amplifier input protection circuit further includes a first current mirror configured to mirror the first clamp current to generate a first mirrored current and to provide the first mirrored current to the source of the third FET. The amplifier input protection circuit further includes a second clamp electrically connected to the second output and configured to activate to generate a second clamp current in response to a second overvoltage condition. The amplifier input protection circuit further includes a second current mirror configured to mirror the second clamp current to generate a second mirrored current and to provide the second mirrored current to the source of the fourth FET.

In another aspect, an amplifier is provided. The amplifier includes a non-inverting input terminal and an inverting input terminal, an amplification circuit including a non-inverting input and an inverting input, and an input protection circuit. The input protection circuit includes a first input electrically connected to the non-inverting input terminal, a second input electrically connected to the inverting input terminal, a first output electrically connected to the non-inverting input of the amplification circuit, and a second output electrically connected to the inverting input of the amplification circuit. The input protection circuit further includes a first FET including a source electrically connected to the first input and a drain electrically connected to the first output, a second FET including a source electrically connected to the second input and a drain electrically connected to the second output, a first clamp electrically connected to the first output and configured to activate to generate a first clamp current in response to a first overvoltage condition, a first current mirror configured to mirror the first clamp current to generate a first mirrored current, a third FET electrically connected between the gate and the source of the first FET and configured to receive the first mirrored current, a second clamp electrically connected to the second output and configured to activate to generate a second clamp current in response to a second overvoltage condition, a second current mirror configured to mirror the second clamp current to generate a second mirrored current, and a fourth FET electrically connected between the gate and the source of the second FET and configured to receive the second mirrored current.

In another aspect, a method of protecting an amplification circuit is provided. The amplification circuit includes a first input electrically connected to a first input terminal via a channel of a first FET and a second input electrically connected to a second input terminal via a channel of a second FET. The method includes activating a first clamp in response to a first overvoltage condition, mirroring a first clamp current through the first clamp to generate a first mirrored current using a first current mirror, increasing a channel impedance of the first FET in response to the first mirrored current using a third FET, activating a second clamp in response to a second overvoltage condition, mirroring a second clamp current through the second clamp to generate a second mirrored current using a second current mirror, and increasing a channel impedance of the second FET in response to the second mirrored current using a fourth FET.

DETAILED DESCRIPTION OF CERTAIN EMBODIMENTS

Figure 1A:
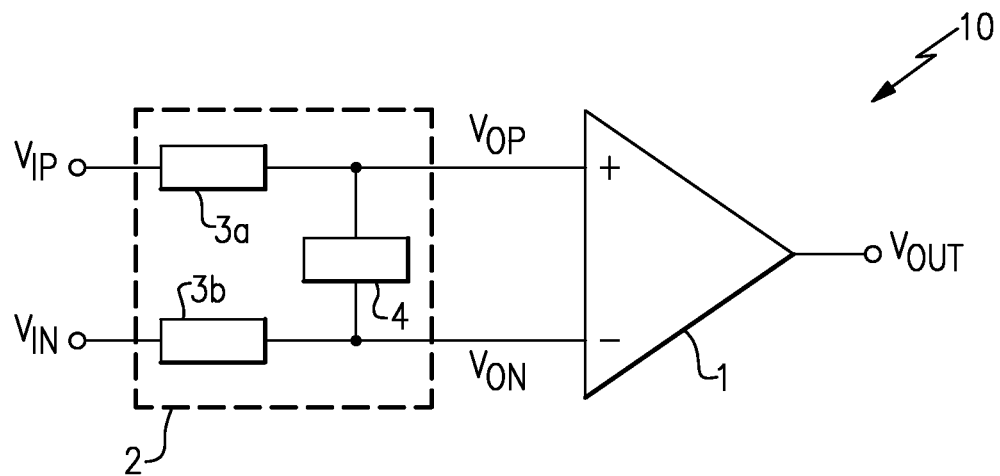
FIG. 1A illustrates one example of an amplifier.

The following detailed description of certain embodiments presents various descriptions of specific embodiments of the invention. However, the invention can be embodied in a multitude of different ways, for example, as defined and covered by the claims. In this description, reference is made to the drawings in which like reference numerals may indicate identical or functionally similar elements.

Figure 1B:
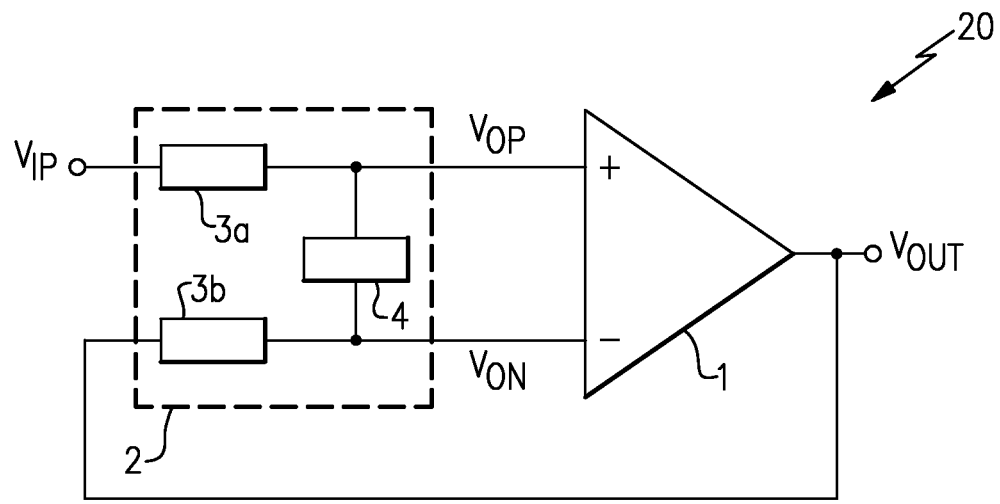
FIG. 1B illustrates the amplifier of FIG. 1A connected in a buffer configuration.

FIG. 1A illustrates one example of an amplifier 10. FIG. 1B illustrates the amplifier 10 of FIG. 1A connected in a buffer configuration 20.

The amplifier 10 includes a first or non-inverting input voltage terminal $V_{IP}$, a second or inverting input voltage terminal $V_{IN}$, an output voltage terminal $V_{OUT}$, an amplification circuit 1, and an input protection circuit 2. The amplification circuit 1 includes a first or non-inverting input, a second or inverting input, and an output. The input protection circuit 2 includes a first input protection component 3a, a second input protection component 3b, and a clamp component 4.

As shown in FIG. 1A, the first input protection component 3a is electrically connected between the non-inverting input voltage terminal $V_{IP}$ and the non-inverting input of the amplification circuit 1, and the second input protection component 3b is electrically connected between the inverting input voltage terminal $V_{IN}$ and the inverting input of the amplification circuit 1. Additionally, the clamp component 4 is electrically connected between the non-inverting and inverting inputs of the amplification circuit 1. Furthermore, the output of the amplification circuit 1 is electrically connected to the output terminal $V_{OUT}$. In the configuration shown in FIG. 1B, the output terminal $V_{OUT}$ has been electrically connected to the inverting input terminal $V_{IN}$ to operate the amplifier 10 as a unity gain buffer.

The input protection circuit 2 can be used to protect the amplification circuit 1 from large input signals received at the non-inverting and inverting input voltage terminals $V_{IP}$, $V_{IN}$. For example, the first input protection component 3a can limit an amount of current flowing from the non-inverting input terminal $V_{IP}$ to the non-inverting input of the amplification circuit 1, and the second input protection component 3b can limit an amount of current flowing from the inverting input terminal $V_{IN}$ to the inverting input of the amplification circuit 1. Additionally, the clamp component 4 can activate when the voltage difference between the amplification circuit's non-inverting and inverting inputs is sufficiently large, thereby limiting a maximum voltage difference between non-inverting and inverting inputs of the amplification circuit 1.

Certain implementations of the input protection circuit 2 can suffer from a trade-off between noise and fault current, both of which can be undesirable. For instance, noise can impact the performance of the amplifier 10 by degrading the amplifier's signal-to-noise ratio (SNR), while fault current can lead to an increase in the amplifier's settling time in response to a relatively fast step input that triggers a fault condition. As persons having ordinary skill in the art will appreciate, fault current can refer to an amplifier's input current when the amplifier's input protection circuit activates in response to an overvoltage or fault condition.

For example, in one input protection scheme, the first and second input protection components 3a, 3b can be implemented as resistors, and the clamp component 4 can be implemented using diode clamps. To prevent the resistors from unduly impacting the noise performance of the amplifier 10, the resistance of the resistors should be relatively small to provide a relatively small input-referred noise. However, using small resistors in the input protection components 3a, 3b can result in the conduction of a relatively large fault current, which can have a magnitude that changes with a magnitude of the differential input signal. When the amplifier is operated with negative feedback, such as in the buffer configuration 20 shown in FIG. 1B, currents can flow from the non-inverting input terminal $V_{IP}$ to the output of the amplification circuit 1 through the input protection circuit 2, thereby increasing the amplifier's settling time in response to a relatively fast step input that triggers a fault condition.

In another input protection scheme, the first and second input protection components 3a, 3b are implemented as junction field effect transistors (JFETs). In such a configuration, fault current can be substantially independent of the magnitude of the differential input signal when the differential input signal is sufficiently large. To provide a relatively small impact on the amplifier's noise performance, such a scheme can use relatively large width JFETs to provide low channel resistance, and thus low noise. However, large width JFETs can conduct large fault currents when the clamp component 4 is active and clamping.

Provided herein are apparatus and methods for amplifier input protection. In certain implementations herein, an input protection circuit includes a first JFET electrically connected between a first input and a first output of the input protection circuit, and a second JFET electrically connected between a second input and a second output of the input protection circuit. The input protection circuit further includes a first clamp electrically connected to the first output for providing protection from a first overvoltage condition, and a second clamp electrically connected to the second output for providing protection from a second overvoltage condition. Additionally, the protection circuit can include a first current mirror that mirrors a current through the first clamp, and provides the mirrored current to a third JFET that is electrically connected between a source and gate of the first JFET. Similarly, the protection circuit can include a second current mirror that mirrors a current through the second clamp, and provides the mirrored current to a fourth JFET that is electrically connected between a source and gate of the second JFET.

Configuring the protection circuit in this manner can provide the benefits of both low noise and low fault current. For example, when an amplifier including the protection circuit is operating with normal signaling conditions, an input signal can be passed from the protection circuit's inputs to outputs through the first and second JFETs, which can be implemented with relatively large width to provide low resistance and low noise. However, when the first clamp activates in response to overvoltage conditions, the first current mirror and the third JFET can operate to dynamically increase the channel impedance of the first JFET to prevent a large fault current flowing through the first JFET's channel in response to activation of the first clamp. For example, when the first clamp activates in response to overvoltage conditions, the first current mirror can generate a mirrored current than turns on the third JFET, which can effectively pinch off the channel of the first JFET and lower its maximum current. Similarly, when the second clamp activates in response to overvoltage conditions, the second current mirror and the fourth JFET can operate to dynamically increase the channel impedance of the second JFET to prevent a large fault current flowing through the second JFET's channel in response to activation of the second clamp.

Accordingly, the input protection circuit can provide input protection with a relatively small amount of noise and/or a relatively small amount of fault current. The teachings herein can be used to provide, for example, enhanced input protection performance relative to a scheme using a pair of resistors or a pair of JFETs alone. Thus, the input protection circuit can be used to provide relatively low noise and relatively small fault current. The input protection circuit can not only reduce fault current and noise, but also can decrease fault recovery time when an amplifier is connected with feedback, such as when the amplifier is operated as a buffer.

In certain implementations, the first JFET includes a source electrically connected to the input protection circuit's first input and a drain connected to the input protection circuit's first output, and the second JFET includes a source connected to the input protection circuit's second input and a drain connected to the input protection circuit's second output. Thus, an input signal provided to the input protection circuit can be configured to pass through the channels of the first and second JFETs. Additionally, in certain configurations, the third JFET can include a source and a gate connected to the gate of the first JFET and a drain connected to the first input, and the fourth JFET having a source and gate connected to the gate of the second JFET and a drain connected to the second input. Thus, when the third JFET activates in response to a first mirrored current generated by the first current mirror, the third JFET can dynamically increase the first JFET's channel impedance. Similarly, when the fourth JFET activates in response to a second mirrored current generated by the second current mirror, the fourth JFET can dynamically increase the second JFET's channel impedance.

While described in connection with JFETs, in alternative embodiments, depletion mode insulated gate transistors, such as depletion-mode metal oxide semiconductor field effect transistors (MOSFETs) can be used in place of the JFETs described herein. It will be understood that these MOSFETs can have gates made out of materials other than metals, such as polycrystalline silicon, and can have dielectric "oxide" regions made from dielectrics other than silicon oxide, such as from silicon nitride or high-k dielectrics.

The first and second clamps can be configured in a variety of ways. For example, in certain implementations, the first and second clamps can be connected between the input protection circuit's first and second outputs, and the first clamp can activate in response to large positive voltage differences, while the second clamp can activate in response to large negative voltage differences. In other implementations, the first clamp can be connected between the first output and a first voltage, and the second clamp can be connected between the second output and the first voltage. Additionally, the first and second clamps can be configured to activate in response to overvoltage conditions referenced relative a second voltage, which can be different from the first voltage.

Figure 2:
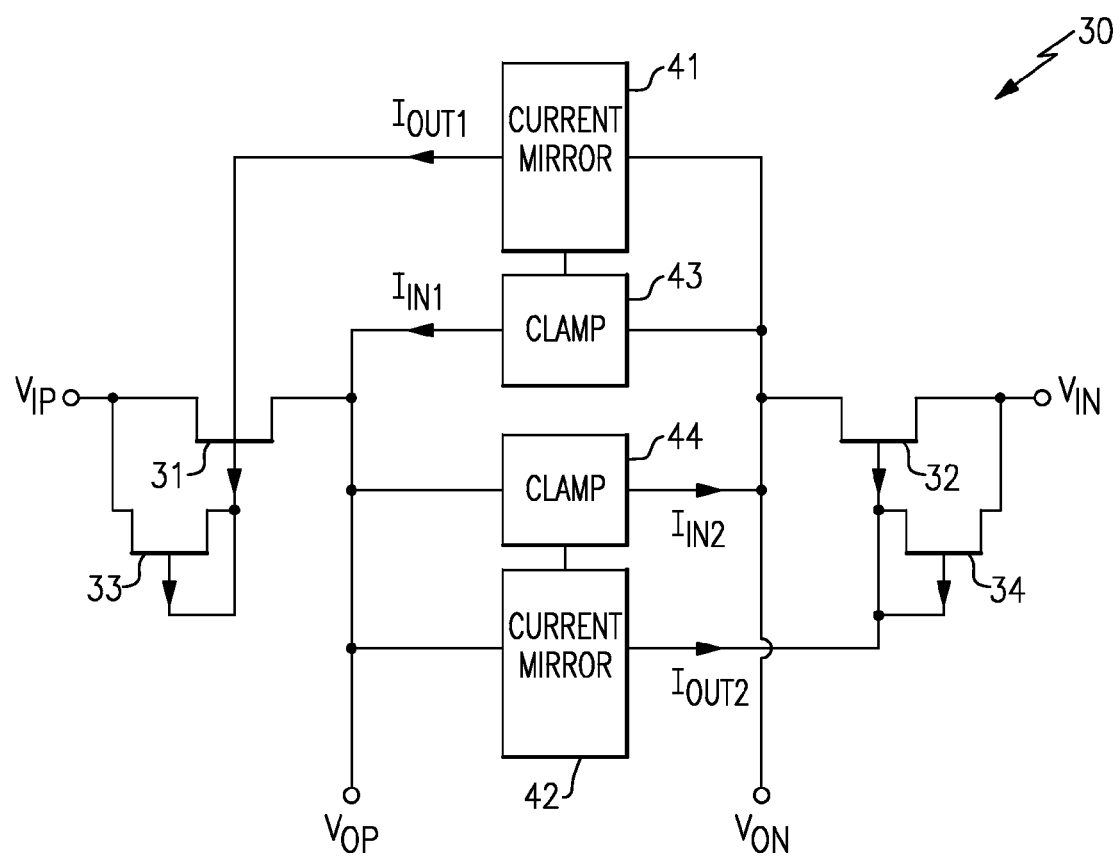
FIG. 2 illustrates one embodiment of an input protection circuit.

FIG. 2 illustrates one embodiment of an input protection circuit 30. The input protection circuit 30 includes a first p-channel JFET 31, a second p-channel JFET 32, a third p-channel JFET 33, a fourth p-channel JFET 34, a first current mirror 41, a second current mirror 42, a first clamp 43, and a second clamp 44. The input protection circuit 30 further includes a first input $V_{IP}$, a second input $V_{IN}$, a first output $V_{OP}$, and a second output $V_{ON}$.

The first p-channel JFET 31 includes a source electrically connected to the first input $V_{IP}$ and a drain electrically connected to the first output $V_{OP}$. The third p-channel JFET 33 includes a drain electrically connected to the first input $V_{IP}$ and a gate and a source electrically connected to the gate of the first p-channel JFET 31. The second p-channel JFET 32 includes a source electrically connected to the second input $V_{IN}$ and a drain electrically connected to the second output $V_{ON}$. The fourth p-channel JFET 34 includes a drain electrically connected to the second input $V_{IN}$ and a gate and a source electrically connected to the gate of the second p-channel JFET 32. The first clamp 43 is electrically connected between the first and second outputs $V_{OP}$, $V_{ON}$. The first current mirror 41 is coupled to the first clamp 43, and is configured to mirror a first clamp current $I_{IN1}$ through the first clamp 43 to generate a first mirrored current $I_{OUT1}$ from the second output $V_{ON}$ to the gate and source of the third p-channel JFET 33. The second clamp 44 is electrically connected between the first and second outputs $V_{OP}$, $V_{ON}$. The second current mirror 42 is coupled to the second clamp 44, and is configured to mirror a second clamp current $I_{IN2}$ through the second clamp 44 to generate a second mirrored current $I_{OUT2}$ from the first output $V_{OP}$ to the gate and source of the fourth p-channel JFET 34.

The illustrated input protection circuit 30 can provide the benefits of both low noise and small fault current.

For example, the first and second p-channel JFETs 31, 32 can be implemented as relatively large width devices, such that the first and second p-channel JFETs 31, 32 have a relatively low resistance during normal operation of the input protection circuit 30. As persons having ordinary skill in the art will appreciate, an amplifier's noise is typically measured with no input signal present at an amplifier's inputs, and can change in relation to the amplifier's input resistance. Since the first and second p-channel JFETs 31, 32 can have a relatively large width and small resistance, the first and second p-channel JFETs 31, 32 can provide a relatively small noise contribution to an amplifier using the input protection circuit 30. When the differential input signal received between the first and second inputs $V_{IP}$, $V_{IN}$ is relatively small, the input protection circuit 30 can provide the differential input signal to the first and second outputs $V_{OP}$, $V_{ON}$, with the first and second p-channel JFETs 31, 32 operating in a linear mode of operation. For example, the first and second p-channel JFETs 31, 32 can be depletion-mode transistors, which are normally on at zero gate-to-source voltage and thus can pass relatively small differential input signals.

However, in response to large differential input signals of positive or negative polarity, the first and/or second clamps 43, 44 can activate to limit a maximum voltage difference between the first and second outputs $V_{OP}$, $V_{ON}$.

Additionally, when the first clamp 43 activates in response to a large input signal that increases the voltage of the second input $V_{IN}$ relative to the voltage of the first input $V_{IP}$, the first current mirror 41 can mirror the first clamp current $I_{IN1}$ through the first clamp 43 to generate the first mirrored current $I_{OUT1}$, and provide the first mirrored current $I_{OUT1}$ to the gate and source of the third p-channel JFET 33. Configuring the input protection circuit 30 in this manner can dynamically increase the impedance of the first p-channel JFET 31 in response to activation of the first clamp 43. In particular, when the first clamp 43 activates, the first mirrored current $I_{OUT1}$ can flow through the third p-channel JFET 33 and increase the gate voltage of the first p-channel JFET 31 relative to the source voltage of the first p-channel JFET 31. Accordingly, the first current mirror 41 and the third p-channel JFET 33 can operate to effectively pinch-off the channel of the first p-channel JFET 31 to reduce fault current when the first clamp 43 is activated.

Similarly, when the second clamp 44 activates in response to a large input signal that increases the voltage of the first input $V_{IP}$ relative to the voltage of the second input $V_{IN}$, the second current mirror 42 can mirror the second clamp current $I_{IN2}$ through the second clamp 44 to generate the second mirrored current $I_{OUT2}$. Additionally, the second current mirror 42 can provide the second mirrored current $I_{OUT2}$ to the gate and source of the fourth p-channel JFET 34, thereby increasing the impedance of the second p-channel JFET 32. In particular, when the second clamp 44 activates, the second mirrored current $I_{OUT2}$ can flow through the fourth p-channel JFET 34 and increase gate voltage of the second p-channel JFET 32 relative to the source voltage of the second p-channel JFET 32. Thus, the second current mirror 42 and the fourth p-channel JFET 34 can operate to effectively pinch-off the channel of the second p-channel JFET 32 to reduce fault current when the second clamp 44 is activated.

Thus, the illustrated input protection circuit 30 can provide the advantages of low noise and small fault current. For example, when the input protection circuit 30 is used in an amplifier connected in negative feedback, the amplifier can have a relatively small fault current can flow from the first input $V_{IP}$ to the second input $V_{IN}$ in response to a step input that triggers a fault condition. Thus, including the input protection circuit 30 can help reduce fault recover time. Furthermore, since the first and second p-channel JFETs 31, 32 can have a relatively large width and small resistance, an amplifier that includes the input protection circuit 30 can have a relatively low noise.

In certain configurations, the first and second p-channel JFETs 31, 32 can have a width-to-length (W/L) ratio that is greater than a W/L ratio of the third and fourth p-channel JFETs 33, 34. For example, in one embodiment, the W/L ratio of the first and second p-channel JFETs 31, 32 is a factor in the range of about 50 to about 250 times greater than the W/L ratio of the third and fourth p-channel JFETs 33, 34. However, other W/L ratios are possible, such as W/L ratios that depend on a particular noise specification or constraint.

Although FIG. 2 illustrates a configuration of an input protection circuit using p-channel JFETs, the teachings herein are applicable to other types of transistors, including, for example, n-channel JFETs, and to depletion mode MOSFETs.

Figure 3A:
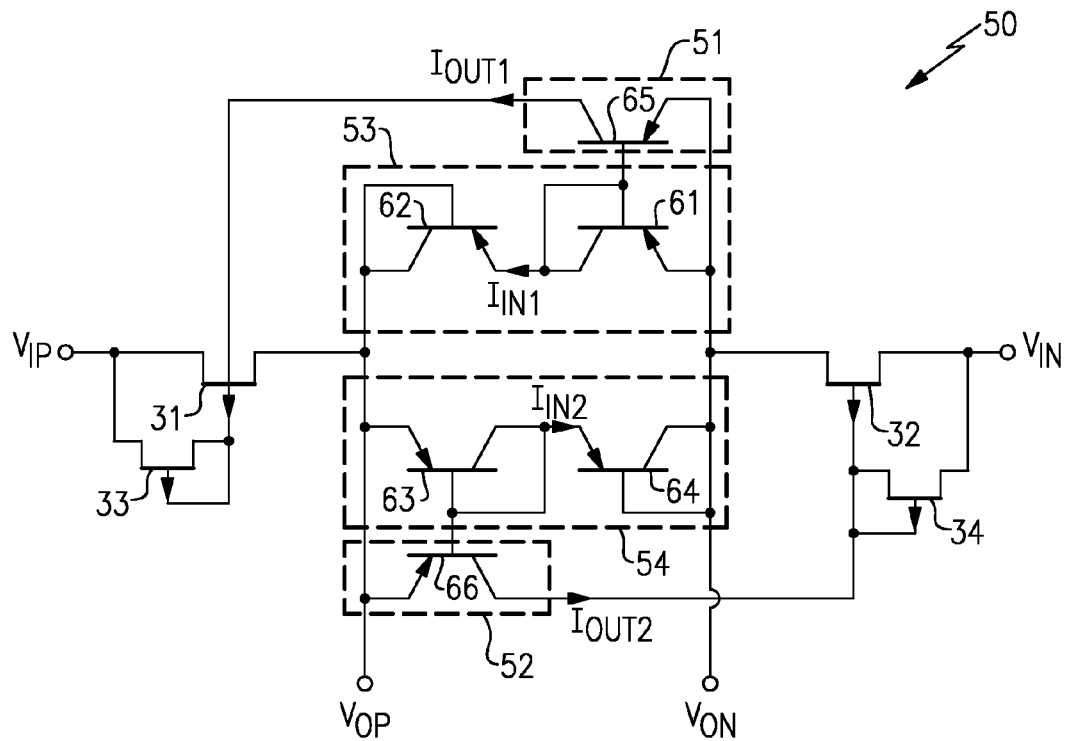
FIG. 3A illustrates another embodiment of an input protection circuit.

FIG. 3A illustrates another embodiment of an input protection circuit 50. The input protection circuit 50 of FIG. 3A is similar to the input protection circuit 30 of FIG. 2, except that the input protection circuit 50 illustrates a specific implementation of the current mirrors and clamps shown in FIG. 2. For example, the input protection circuit 50 includes the first and second current mirrors 51, 52 and the first and second clamps 53, 54.

In the illustrated configuration, the first clamp 53 includes a first PNP clamp transistor 61 and a second PNP clamp transistor 62, and the first current mirror 51 includes a first PNP current mirror transistor 65. As shown in FIG. 3A, the base and collector of the second PNP clamp transistor 62 is electrically connected to the first output $V_{OP}$, and the emitter of the second PNP clamp transistor 62 is electrically connected to the base and collector of the first PNP clamp transistor 61 and to the base of the first PNP current mirror transistor 65. Furthermore, the emitter of the first PNP clamp transistor 61 and the emitter of the first PNP current mirror transistor 65 are electrically connected to the second output $V_{ON}$. Additionally, the collector of the first PNP current mirror transistor 65 is electrically connected to the source and gate of the third p-channel JFET 33.

Additionally, in the illustrated configuration, the second clamp 54 includes a third PNP clamp transistor 63 and a fourth PNP clamp transistor 64, and the second current mirror 52 includes a second PNP current mirror transistor 66. As shown in FIG. 3A, the base and collector of the fourth PNP clamp transistor 64 is electrically connected to the second output $V_{ON}$, and the emitter of the fourth PNP clamp transistor 64 is electrically connected to the base and collector of the third PNP clamp transistor 63 and to the base of the second PNP current mirror transistor 66. Furthermore, the emitter of the third PNP clamp transistor 63 and the emitter of the second PNP current mirror transistor 66 are electrically connected to the first output $V_{OP}$. Additionally, the collector of the second PNP current mirror transistor 66 is electrically connected to the source and gate of the fourth p-channel JFET 34.

In the illustrated configuration, the first clamp 53 includes two diode-connected PNP bipolar transistors that can activate when the voltage level of the second input $V_{IN}$ is about two diode forward voltages greater than the voltage level of the first input $V_{IP}$. The first PNP current mirror transistor 65 can be used to mirror the first clamp current $I_{IN1}$ through the first PNP clamp transistor 61, and to provide the first mirrored current $I_{OUT1}$ to the third p-channel JFET 33. The first mirrored current $I_{OUT1}$ can flow through the third p-channel JFET 33, thereby increasing the impedance of the first p-channel JFET 31 by increasing the gate voltage of the p-channel JFET 31 relative to the source voltage. Similarly, in the illustrated configuration, the second clamp 54 includes two diode-connected PNP bipolar transistors that can activate when the voltage level of the first input $V_{IP}$ is about two diode forward voltages greater than the voltage level of the second input $V_{IN}$.

Although the first and second clamps 53, 54 are each illustrated as including two diode-connected bipolar transistors, other configurations are possible. For example, the teachings herein are applicable to configurations using more or fewer diode-connected bipolar transistors, and/or to configurations using other implementations of clamps. Additionally, although one example implementation of the first and second current mirrors has been illustrated, the teachings herein are applicable to other arrangements.

Figure 3B:
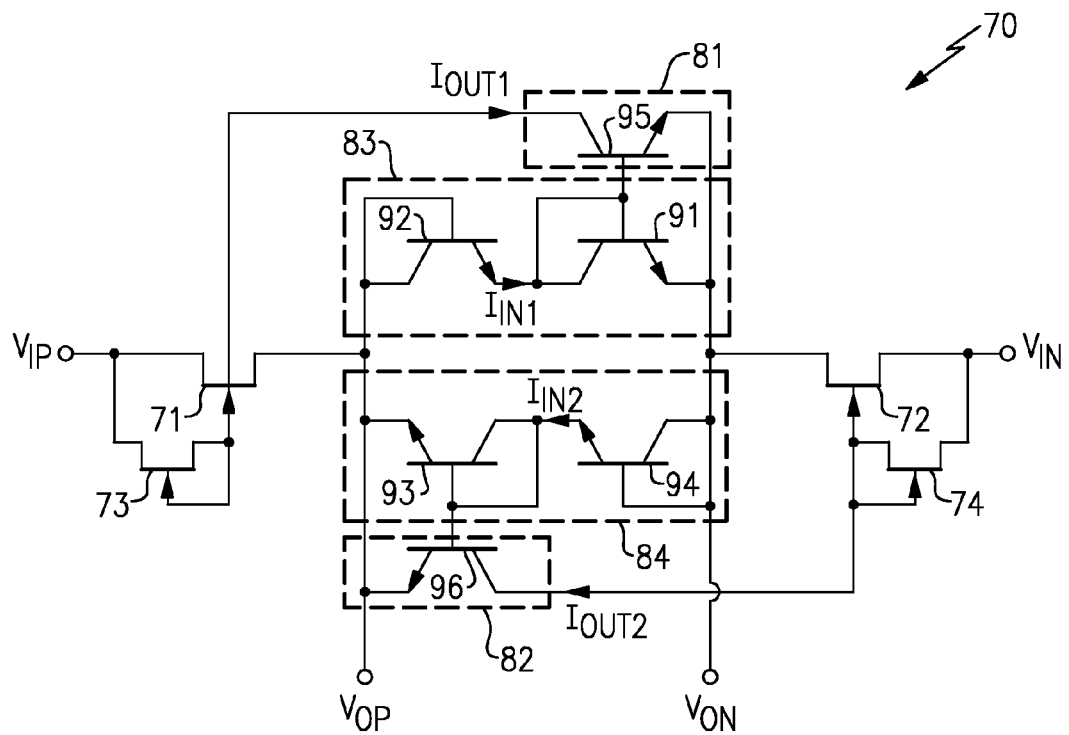
FIG. 3B illustrates another embodiment of an input protection circuit.

FIG. 3B illustrates another embodiment of an input protection circuit 70. The input protection circuit 70 includes a first n-channel JFET 71, a second n-channel JFET 72, a third n-channel JFET 73, a fourth n-channel JFET 74, a first current mirror 81, a second current mirror 82, a first clamp 83, and a second clamp 84. The input protection circuit 70 further includes first and second inputs $V_{IP}$, $V_{IN}$ and first and second outputs $V_{OP}$, $V_{ON}$. The first clamp 83 includes first and second NPN clamp transistors 91, 92, and the first current mirror 81 includes a first NPN current mirror transistor 95. The second clamp 84 includes third and fourth NPN clamp transistors 93, 94, and the second current mirror 82 includes a second NPN current mirror transistor 96.

The input protection circuit 70 of FIG. 3B is similar to the input protection circuit 50 of FIG. 3A, except that the input protection circuit 70 is implemented using an n-type configuration rather than a p-type configuration. Although FIG. 3A illustrates a configuration using all p-type transistors and FIG. 3B illustrates a configuration using all n-type transistors, the teachings herein are also applicable to configurations using a combination of p-type and n-type transistors.

When a large input signal causes the voltage level of the first input $V_{IP}$ to increase relative to the voltage level of the second input $V_{IN}$, the first clamp 83 can activate. Additionally, the first current mirror 81 can mirror the first clamp current $I_{IN1}$ through the first clamp 83 and provide the first mirrored current $I_{OUT1}$ to the third n-channel JFET 73. The first mirrored current $I_{OUT1}$ can pass through the third n-channel JFET 73, thereby increasing the impedance of the first n-channel JFET 71 by increasing the first n-channel JFET's source voltage relative to the gate voltage. Similarly, when a large input signal causes the voltage level of the second input $V_{IN}$ to increase relative to the voltage level of the first input $V_{IP}$, the first clamp 83 can activate. Additionally, the second current mirror 82 can mirror the second clamp current $I_{IN2}$ through the second clamp 84 and provide the second mirrored current $I_{OUT2}$ to the fourth n-channel JFET 74. The second mirrored current $I_{OUT2}$ can pass through the fourth n-channel JFET 74, thereby increasing the impedance of the second n-channel JFET 72 by increasing the second n-channel JFET's source voltage relative to the gate voltage. Additional details of the input protection circuit 70 of FIG. 3B can be similar to those described earlier.

Figure 4:
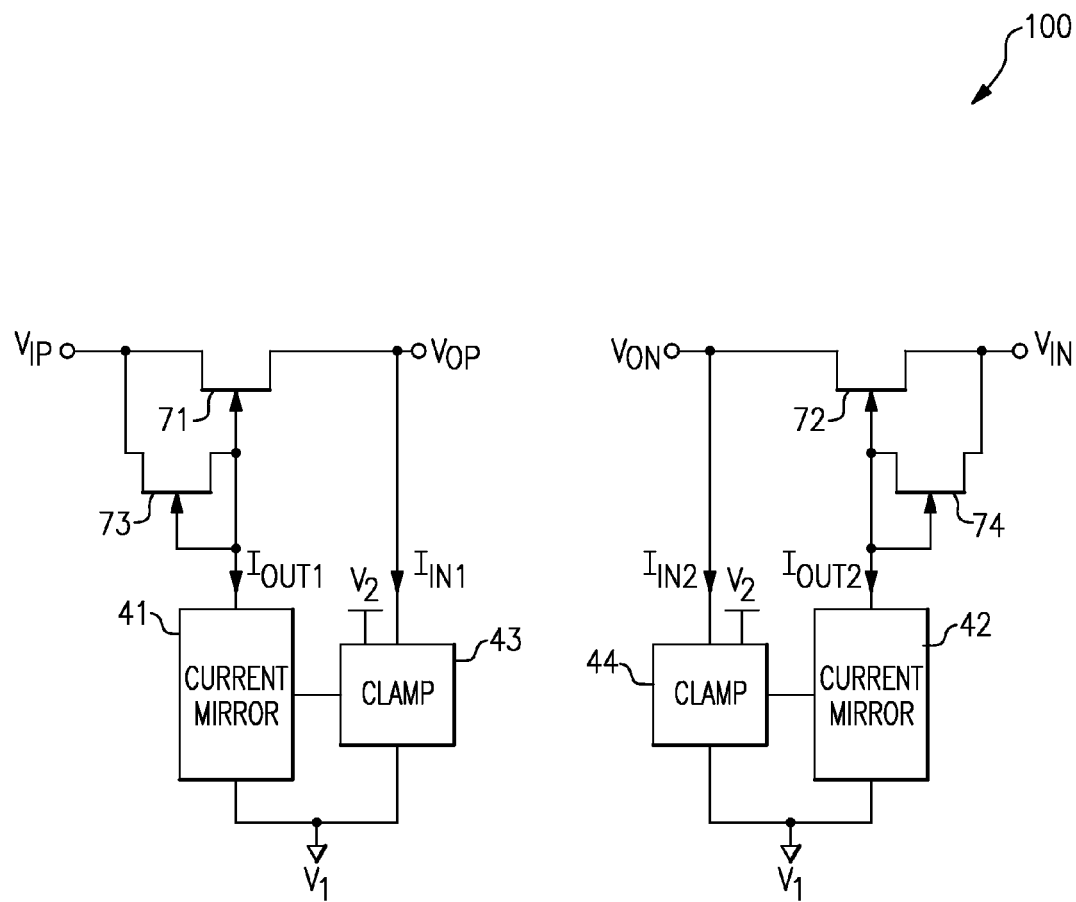
FIG. 4 illustrates another embodiment of an input protection circuit.

FIG. 4 illustrates another embodiment of an input protection circuit 100. The illustrated input protection circuit 100 includes first and second n-channel JFETs 71, 72, third and fourth n-channel JFETs 73, 74, first and second current mirrors 41, 42, and first and second clamps 43, 44. The input protection circuit 100 further includes first and second inputs $V_{IP}$, $V_{IN}$ and first and second outputs $V_{OP}$, $V_{ON}$.

In contrast to the input protection circuit 30 of FIG. 2 which uses p-channel JFETs, the illustrated input protection circuit 100 of FIG. 4 illustrates a protection scheme using n-channel JFETs. However, other configurations are possible, including, for example, configurations in which the illustrated input protection circuit 100 is adapted to operate using p-channel JFETs or a combination of n-channel and p-channel JFETs.

Additionally, in contrast to the input protection circuit 30 of FIG. 2 in which the first and second clamps 43, 44 are connected differentially between the first and second outputs $V_{OP}$, $V_{ON}$, in the illustrated configuration, the first clamp 43 is electrically connected between the first output $V_{OP}$ and a first voltage $V_1$, and the second clamp 44 is electrically connected between the second output $V_{ON}$ and the first voltage $V_1$. Accordingly, the illustrated input protection circuit 100 is illustrated in a common mode configuration, rather than in a differential configuration.

In the illustrated configuration, the input protection circuit 100 can be used to protect an amplifier from overvoltage conditions referenced relative to the second voltage $V_2$. For example, the first clamp 43 can be configured to activate in response to an overvoltage condition that increases the voltage of the first input $V_{IP}$ relative to the second voltage $V_2$, and the second clamp 44 can be configured to activate in response to an overvoltage condition that increases the voltage of the second input $V_{IN}$ relative to the second voltage $V_2$. In certain configurations, the first and second voltages $V_1$, $V_2$ can correspond to power low and power high supply voltages, respectively. However, other configurations are possible.

When the first clamp 43 activates, the first clamp current $I_{IN1}$ can flow from the first output $V_{OP}$ to the first voltage $V_1$ through the first clamp 43. Additionally, the first current mirror 41 can mirror the first clamp current $I_{IN1}$, and provide the first mirrored current $I_{OUT1}$ to the third n-channel JFET 73. Additionally, when the second clamp 44 activates, the second clamp current $I_{IN2}$ can flow from the second output $V_{ON}$ to the first voltage $V_1$ through the second clamp 44. Additionally, the second current mirror 42 can mirror the second clamp current $I_{IN2}$, and provide the second mirrored current $I_{OUT2}$ to the fourth n-channel JFET 74.

Additional details of the input protection circuit 100 can be similar to those described earlier.

Figure 5:
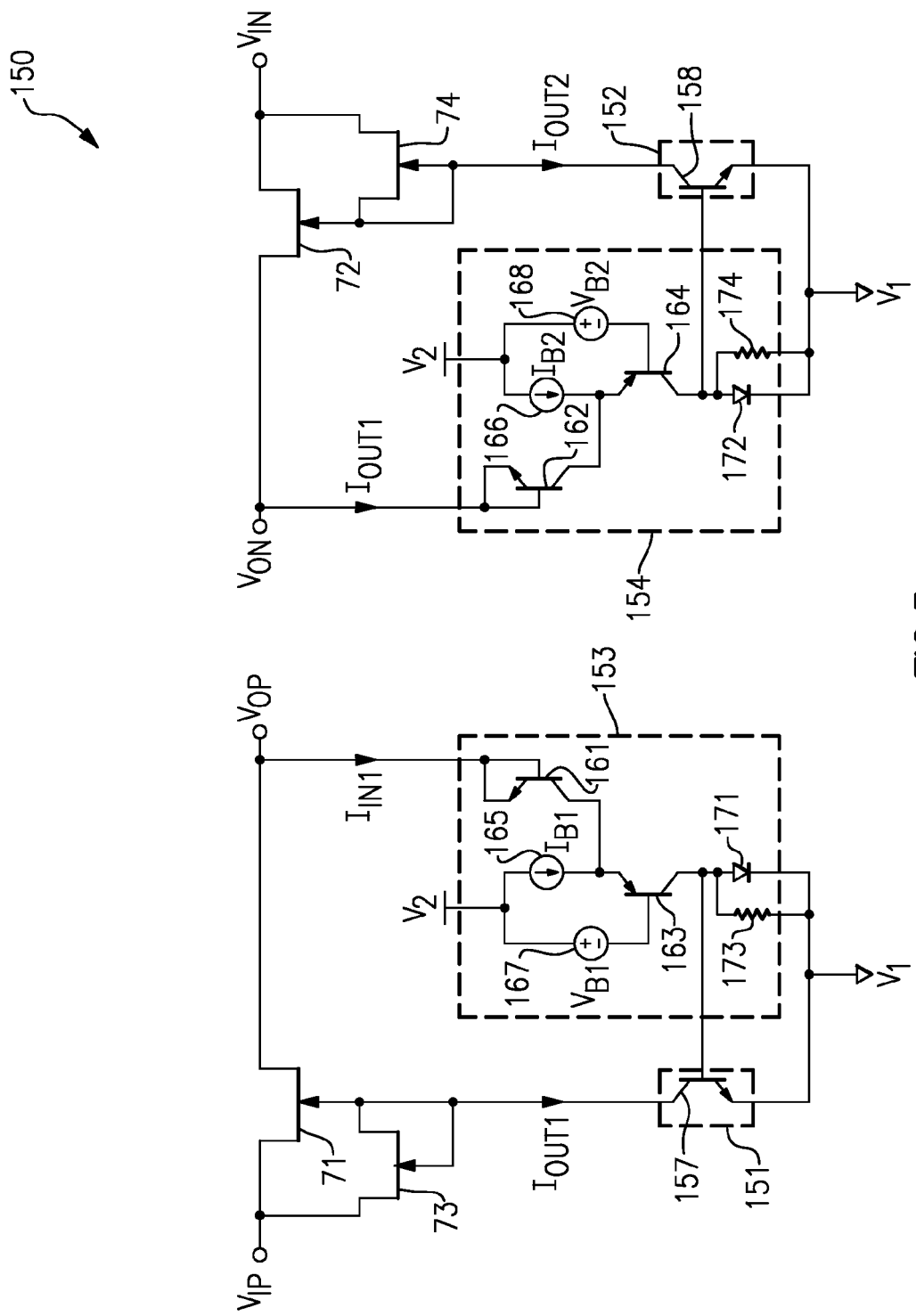
FIG. 5 illustrates another embodiment of an input protection circuit.

FIG. 5 illustrates another embodiment of an input protection circuit 150.

The illustrated input protection circuit 150 includes first and second n-channel JFETs 71, 72, third and fourth n-channel JFETs 73, 74, first and second current mirrors 151, 152, and first and second clamps 153, 154. The input protection circuit 150 further includes first and second inputs $V_{IP}$, $V_{IN}$ and first and second outputs $V_{OP}$, $V_{ON}$.

The first clamp 153 includes a first NPN bipolar transistor 161, a first PNP bipolar transistor 163, a first current source 165, a first voltage source 167, a first diode 171, and a first resistor 173. The second clamp 154 includes a second NPN bipolar transistor 162, a second PNP bipolar transistor 164, a second current source 166, a second voltage source 168, a second diode 172, and a second resistor 174. The first current mirror 151 includes a third NPN bipolar transistor 157, and the second current mirror 152 includes a fourth NPN bipolar transistor 158.

The first voltage source 167 includes a first end electrically connected to the second voltage $V_2$, and a second end electrically connected to a base of the first PNP bipolar transistor 163. The first current source 165 includes a first end electrically connected to the second voltage $V_2$, and a second end electrically connected to an emitter of the first PNP bipolar transistor 163 and to the collector of the first NPN bipolar transistor 161. The first NPN bipolar transistor 161 further includes a base and emitter electrically connected to the first output $V_{OP}$. The first PNP bipolar transistor 163 further includes a collector electrically connected to a first end of the first resistor 173, to an anode of the first diode 171, and to a base of the third NPN bipolar transistor 157. The first resistor 173 further includes a second end electrically connected to the first voltage $V_1$, and the first diode 171 further includes a cathode electrically connected to the first voltage $V_1$. The third NPN bipolar transistor 157 further includes an emitter electrically connected to the first voltage $V_1$, and a collector configured to generate the first mirrored current $I_{OUT1}$.

The second voltage source 168 includes a first end electrically connected to the second voltage $V_2$, and a second end electrically connected to a base of the second PNP bipolar transistor 164. The second current source 166 includes a first end electrically connected to the second voltage $V_2$, and a second end electrically connected to an emitter of the second PNP bipolar transistor 164 and to the collector of the second NPN bipolar transistor 162. The second NPN bipolar transistor 162 further includes a base and emitter electrically connected to the second output $V_{ON}$. The second PNP bipolar transistor 164 further includes a collector electrically connected to a first end of the second resistor 174, to an anode of the second diode 172, and to a base of the fourth NPN bipolar transistor 158. The second resistor 174 further includes a second end electrically connected to the first voltage $V_1$, and the second diode 172 further includes a cathode electrically connected to the first voltage $V_1$. The fourth NPN bipolar transistor 158 further includes an emitter electrically connected to the first voltage $V_1$, and a collector configured to generate the second mirrored current $I_{OUT2}$.

During normal signaling conditions on the first and second outputs $V_{OP}$, $V_{ON}$, the first and second clamps 153, 154 can remain off. However, during an overvoltage condition that increases the voltage of the first input $V_{IP}$ relative to the second voltage $V_2$, the first NPN bipolar transistor 161, which operates as a collector-base diode, can activate. Additionally, the first clamp current $I_{IN1}$ can flow through the first PNP bipolar transistor 163 and through the first diode 171, and can be mirrored by the third NPN bipolar transistor 157 to generate the first mirrored current $I_{OUT1}$. Similarly, during an overvoltage condition that increases the voltage of the second input $V_{IN}$ relative to the second voltage $V_2$, the second NPN bipolar transistor 162 which operates as a collector-base diode, can activate. Additionally, the second clamp current $I_{IN2}$ can flow from through the second PNP bipolar transistor 164 and through the second diode 172, and can be mirrored by the fourth NPN bipolar transistor 158 to generate the second mirrored current $I_{OUT2}$.

The first and second voltage sources $V_{B1}$, $V_{B2}$ can be used to control the activation voltage of the first and second clamps 153, 154, respectively, relative to the second voltage $V_2$. For example, the first and second voltage sources $V_{B1}$, $V_{B2}$ can be used to control the base voltages of the first and second PNP bipolar transistors 163, 164, thereby controlling the voltage level of the first and second outputs $V_{OP}$, $V_{ON}$ corresponding to activation of the first and second PNP bipolar transistors 163, 164.

In the illustrated configuration, the emitters of the first and second PNP bipolar transistors 163, 164, respectively, are biased using currents generated from the first and second current sources 165, 166, respectively. Biasing the first and second PNP bipolar transistors 163, 164 in this manner can aid in establishing an emitter voltage of the first and second PNP bipolar transistors 163, 164 during normal signal conditions on the first and second output nodes $V_{OP}$, $V_{ON}$.

The illustrated input protection circuit 150 further includes the first and second resistors 173, 174, which have been electrically connected in parallel with the first and second diodes 171, 172, respectively. During normal signal conditions on the first and second output nodes $V_{OP}$, $V_{ON}$, the bias currents generated by the first and second current sources 165, 166 can flow through the first and second resistors 173, 174. Including the first and second resistors 173, 174 can aid in preventing the bias currents generated by first and second current sources 165, 166 from being mirrored by the first and second current mirrors 151, 152 during normal operation. However, when the first clamp 153 activates in response to an overvoltage condition, the first clamp current $I_{IN1}$ can flow through the first diode 171, and can be mirrored by the first current mirror 151. Similarly, when the second clamp 154 activates in response to an overvoltage condition, the second clamp current $I_{IN2}$ can flow through the second diode 172, and can be mirrored by the second current mirror 152.

The input protection circuit 150 of FIG. 5 illustrates one implementation of the input protection circuit 100 of FIG. 4. However, the input protection circuit 100 of FIG. 4 can be implemented in other ways.

Additional details of the input protection circuit 150 of FIG. 5 can be as described earlier.

The methods, systems, and/or apparatus described above can be implemented in integrated circuits and into various electronic devices. Examples of the electronic devices can include, but are not limited to, consumer electronic products, parts of the consumer electronic products, electronic test equipment, etc. Examples of parts of consumer electronic products can include amplifiers, rectifiers, programmable filters, attenuators, variable frequency circuits, etc. Examples of the electronic devices can also include memory chips, memory modules, circuits of optical networks or other communication networks, and disk driver circuits. The consumer electronic products can include, but are not limited to, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected," as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. An amplifier input protection circuit comprising:
a first field effect transistor (FET) including a source electrically connected to a first input and a drain electrically connected to a first output;
a second FET including a source electrically connected to a second input and a drain electrically connected to a second output;
a third FET including a gate and a source electrically connected to a gate of the first FET and a drain electrically connected to the first input;
a fourth FET including a gate and a source electrically connected to a gate of the second FET and a drain electrically connected to the second input;
a first clamp electrically connected to the first output, wherein the first clamp is configured to activate to generate a first clamp current in response to a first overvoltage condition;
a first current mirror configured to mirror the first clamp current to generate a first mirrored current, wherein the first current mirror is configured to provide the first mirrored current to the source of the third FET;
a second clamp electrically connected to the second output, wherein the second clamp is configured to activate to generate a second clamp current in response to a second overvoltage condition; and
a second current mirror configured to mirror the second clamp current to generate a second mirrored current, wherein the second current mirror is configured to provide the second mirrored current to the source of the fourth FET.

2. The amplifier input protection circuit of claim 1, wherein the third FET is configured to increase a channel impedance of the first FET in response to the first mirrored current, and wherein the fourth FET is configured to increase a channel impedance of the second FET in response to the second mirrored current.

3. The amplifier input protection circuit of claim 1, wherein the first FET, the second FET, the third FET, and the fourth FET comprise n-channel junction FETs (JFETs).

4. The amplifier input protection circuit of claim 1, wherein the first FET, the second FET, the third FET, and the fourth FET comprise p-channel JFETs.

5. The amplifier input protection circuit of claim 1, wherein the first and second FETs have a first width-to-length ratio, and wherein the third and fourth FETs have a second width-to-length ratio, wherein the first width-to-length ratio is greater than the second width-to-length ratio.

6. The amplifier input protection circuit of claim 1, wherein the first clamp comprises at least one diode-connected bipolar transistor, and wherein the second clamp comprises at least one diode-connected bipolar transistor.

7. The amplifier input protection circuit of claim 1, wherein the first current mirror comprises a first bipolar current mirror transistor, wherein the first bipolar current mirror transistor comprises a base electrically connected to a base of a first diode-connected bipolar transistor of the first clamp, wherein the second current mirror comprises a second bipolar current mirror transistor, wherein the second bipolar current mirror transistor comprises a base electrically connected to a base of a second diode-connected bipolar transistor of the second clamp.

8. The amplifier input protection circuit of claim 1, wherein the first clamp is electrically connected between the first and second outputs, wherein the first overvoltage condition comprises an overvoltage of the first input relative to the second input, wherein the second clamp is electrically connected between the first and second outputs, wherein the second overvoltage condition comprises an overvoltage of the second input relative to the first input.

9. The amplifier input protection circuit of claim 1, wherein the first clamp is electrically connected between the first output and a first voltage, wherein the first overvoltage condition comprises an overvoltage of the first input relative to a second voltage, wherein the second clamp is electrically connected between the second output and the first voltage, wherein the second overvoltage condition comprises an overvoltage of the second input relative to the second voltage.

10. The amplifier input protection circuit of claim 9, wherein the first clamp comprises:
a first bipolar transistor including an emitter configured to receive a first bias current, wherein the emitter of the first bipolar transistor is further configured to receive the first clamp current when the first clamp is activated; and
a first resistor electrically connected between a collector of the first bipolar transistor and the first voltage;
wherein the second clamp comprises:
a second bipolar transistor including an emitter configured to receive a second bias current, wherein the emitter of the second bipolar transistor is further configured to receive the second clamp current when the second clamp is activated; and
a second resistor electrically connected between a collector of the second bipolar transistor and the first voltage.

11. The amplifier input protection circuit of claim 10, wherein the first clamp further comprises:
a first diode including an anode electrically connected to the collector of the first bipolar transistor and a cathode electrically connected to the first voltage;
a first voltage source including a first end electrically connected to the second voltage and a second end electrically connected to a base of the first bipolar transistor;
wherein the second clamp comprises:
a second diode including an anode electrically connected to the collector of the second bipolar transistor and a cathode electrically connected to the first voltage;
a second voltage source including a first end electrically connected to the second voltage and a second end electrically connected to a base of the second bipolar transistor,
wherein the first current mirror comprises a third bipolar transistor having a base electrically connected to the anode of the first diode, an emitter electrically connected to the first voltage, and a collector configured to generate the first mirrored current,
wherein the second current mirror comprises a fourth bipolar transistor having a base electrically connected to the anode of the second diode, an emitter electrically connected to the first voltage, and a collector configured to generate the second mirrored current.

12. An amplifier comprising:
a non-inverting input terminal and an inverting input terminal;
an amplification circuit comprising a non-inverting input and an inverting input;
an input protection circuit comprising a first input electrically connected to the non-inverting input terminal, a second input electrically connected to the inverting input terminal, a first output electrically connected to the non-inverting input of the amplification circuit, and a second output electrically connected to the inverting input of the amplification circuit, wherein the input protection circuit comprises:
a first field effect transistor (FET) including a source electrically connected to the first input and a drain electrically connected to the first output;
a second FET including a source electrically connected to the second input and a drain electrically connected to the second output;
a first clamp electrically connected to the first output, wherein the first clamp is configured to activate to generate a first clamp current in response to a first overvoltage condition;
a first current mirror configured to mirror the first clamp current to generate a first mirrored current;
a third FET electrically connected between the gate and the source of the first FET, wherein the third FET is configured to receive the first mirrored current;
a second clamp electrically connected to the second output, wherein the second clamp is configured to activate to generate a second clamp current in response to a second overvoltage condition;
a second current mirror configured to mirror the second clamp current to generate a second mirrored current; and
a fourth FET electrically connected between the gate and the source of the second FET, wherein the fourth FET is configured to receive the second mirrored current.

13. The amplifier of claim 12, wherein the third FET is configured to increase a channel impedance of the first FET in response to the first mirrored current, and wherein the fourth FET is configured to increase a channel impedance of the second FET in response to the second mirrored current.

14. The amplifier of claim 12, wherein the first FET, the second FET, the third FET, and the fourth FET comprise n-channel JFETs.

15. The amplifier of claim 12, wherein the first FET, the second FET, the third FET, and the fourth FET comprise p-channel JFETs.

16. The amplifier of claim 12, wherein the first and second FETs have a first width-to-length ratio, and wherein the third and fourth FETs have a second width-to-length ratio, wherein the first width-to-length ratio is greater than the second width-to-length ratio.

17. The amplifier of claim 12, wherein the amplification circuit further comprises an output electrically connected to the inverting input terminal via feedback, wherein when the first clamp is activated the third FET increases a channel impedance of the first FET in response to the first mirrored current to reduce a flow of current from the non-inverting input terminal to the output of the amplification circuit.

18. The amplifier of claim 12, wherein the first clamp comprises at least one diode-connected bipolar transistor, and wherein the second clamp comprises at least one diode-connected bipolar transistor.

19. The amplifier of claim 12, wherein the third FET comprises a gate and a source electrically connected to a gate of the first FET and a drain electrically connected to the first input, wherein the fourth FET comprises a gate and a source electrically connected to a gate of the second FET and a drain electrically connected to the second input.

20. A method of protecting an amplification circuit having a first input electrically connected to a first input terminal via a channel of a first FET and having a second input electrically connected to a second input terminal via a channel of a second FET, the method comprising:
  activating a first clamp in response to a first overvoltage condition;
  mirroring a first clamp current through the first clamp to generate a first mirrored current using a first current mirror;
  increasing a channel impedance of the first FET in response to the first mirrored current using a third FET;
  activating a second clamp in response to a second overvoltage condition;
  mirroring a second clamp current through the second clamp to generate a second mirrored current using a second current mirror; and
  increasing a channel impedance of the second FET in response to the second mirrored current using a fourth FET.

* * * * *